(12) United States Patent
Ramsbey et al.

(10) Patent No.: US 6,465,306 B1
(45) Date of Patent: Oct. 15, 2002

(54) SIMULTANEOUS FORMATION OF CHARGE STORAGE AND BITLINE TO WORDLINE ISOLATION

(75) Inventors: Mark T. Ramsbey, Sunnyvale, CA (US); Jean Y. Yang, Sunnyvale, CA (US); Hidehiko Shiraiwa, San Jose, CA (US); Michael A. Van Buskirk, Saratoga, CA (US); David M. Rogers, Sunnyvale, CA (US); Ravi Sunkavalli, Santa Clara, CA (US); Janet Wang, San Francisco, CA (US); Narbeh Derhacobian, Belmont, CA (US); Yider Wu, San Jose, CA (US)

(73) Assignees: Advanced Micro Devices, Inc., Sunnyvale, CA (US); Fujitsu Limited (JP)

( * ) Notice: Subject to any disclaimer, the term of this patent is extended or adjusted under 35 U.S.C. 154(b) by 1 day.

(21) Appl. No.: 09/723,635

(22) Filed: Nov. 28, 2000

(51) Int. Cl.$^7$ ............................................. H01L 21/336
(52) U.S. Cl. ................... 438/279; 438/261; 438/264; 438/287; 438/288; 438/594; 438/981
(58) Field of Search ................... 438/200, 201, 438/211, 216, 257, 258, 261, 262, 263, 264, 266, 275, 279, 282, 287, 288, 289, 298, 526, 585, 591, 593, 594, 981

(56) References Cited

U.S. PATENT DOCUMENTS

| | | | |
|---|---|---|---|
| 4,173,766 A | 11/1979 | Hayes | 357/23 |
| 5,168,334 A | 12/1992 | Mitchell et al. | 257/324 |
| 5,349,221 A | 9/1994 | Shimoji | 257/324 |
| 5,644,533 A | 7/1997 | Lancaster et al. | 365/185.18 |
| 5,751,037 A | 5/1998 | Aozasa et al. | 257/315 |
| 5,768,192 A | 6/1998 | Eitan | 365/185.24 |
| 5,825,686 A | 10/1998 | Schmitt-Landsiedel et al. | 365/185.03 |
| 5,963,465 A | 10/1999 | Eitan | 365/63 |
| 5,966,603 A * | 10/1999 | Eitan | 438/258 |
| 6,001,709 A | 12/1999 | Chuang et al. | 438/440 |
| 6,011,725 A | 1/2000 | Eitan | 365/185.33 |
| 6,030,871 A | 2/2000 | Eitan | 438/276 |
| 6,117,730 A * | 9/2000 | Komori et al. | 438/258 |
| 6,287,917 B1 * | 9/2001 | Park et al. | 438/262 |
| 6,326,268 B1 * | 12/2001 | Park et al. | 438/262 |

FOREIGN PATENT DOCUMENTS

| | | | |
|---|---|---|---|
| JP | 3227069 | 10/1991 | H01L/29/788 |
| JP | 6291330 | 10/1994 | H01L/29/788 |
| WO | WO9960631 | 11/1999 | H01L/29/792 |

OTHER PUBLICATIONS

"A True Single–Transistor Oxide–Nitride–Oxide EEPROM Device," T.Y. Chan, et al., IEEE Electron Device Letters, vol. EDL 8, No. 3, Mar. 1987, p. 93–95.

"An Electrically Alterable Nonvolatile Memory Cell Using a Floating–Gate Structure," Daniel C. Guterman, et al., IEEE Transactions on Electron Devices, vol. ED–26, No. 4, Apr. 1979, p. 576–586.

"NROM: A Novel Localized Trapping, 2–Bit Nonvolatile Memory Cell," Boaz Eitan, et al., IEEE Electron Device Letters, vol. 21, No. 11 Nov. 2000, p. 543–545.

* cited by examiner

Primary Examiner—Tuan H. Nguyen
Assistant Examiner—Jack Chen
(74) Attorney, Agent, or Firm—Amin & Turocy, LLP

(57) ABSTRACT

One aspect of the present invention relates to a method of forming a non-volatile semiconductor memory device, involving the sequential or non-sequential steps of forming a charge trapping dielectric over a substrate, the substrate having a core region and a periphery region; removing at least a portion of the charge trapping dielectric in the periphery region; forming a gate dielectric in the periphery region; forming buried bitlines in the core region; and forming gates in the core region and the periphery region.

21 Claims, 10 Drawing Sheets

SIMULTANEOUS FORMATION OF CHARGE STORAGE AND BITLINE TO WORDLINE ISOLATION

TECHNICAL FIELD

The present invention generally relates to fabricating nonvolatile memory devices. In particular, the present invention relates to improved methods of fabricating SONOS type nonvolatile memory devices.

BACKGROUND ART

Conventional floating gate flash memory types of EEPROMs (electrically erasable programmable read only memory), employ a memory cell characterized by a vertical stack of a tunnel oxide, a first polysilicon layer over the tunnel oxide, an ONO (oxide-nitride-oxide) interlevel dielectric over the first polysilicon layer, and a second polysilicon layer over the ONO interlevel dielectric. For example, Guterman et al (IEEE Transactions on Electron Devices, Vol. 26, No. 4, p. 576, 1979) relates to a floating gate nonvolatile memory cell consisting of a floating gate sandwiched between a gate oxide and an interlevel oxide, with a control gate over the interlevel oxide.

Generally speaking, a flash memory cell is programmed by inducing hot electron injection from a portion of the substrate, such as the channel section near the drain region, to the floating gate. Electron injection carries negative charge into the floating gate. The injection mechanism can be induced by grounding the source region and a bulk portion of the substrate and applying a relatively high positive voltage to the control electrode to create an electron attracting field and applying a positive voltage of moderate magnitude to the drain region in order to generate "hot" (high energy) electrons. After sufficient negative charge accumulates on the floating gate, the negative potential of the floating gate raises the threshold voltage of its field effect transistor (FET) and inhibits current flow through the channel region through a subsequent "read" mode. The magnitude of the read current is used to determine whether or not a flash memory cell is programmed. The act of discharging the floating gate of a flash memory cell is called the erase function. The erase function is typically carried out by a Fowler-Nordheim tunneling mechanism between the floating gate and the source region of the transistor (source erase or negative gate erase) or between the floating gate and the substrate (channel erase). A source erase operation is induced by applying a high positive voltage to the source region and a 0 V to the control gate and the substrate while floating the drain of the respective memory cell.

Subsequently, SONOS (Silicon Oxide Nitride Oxide Silicon) type memory devices have been introduced. See Chan et al, IEEE Electron Device Letters, Vol. 8, No. 3, p. 93, 1987. SONOS type flash memory cells are constructed having a charge trapping non-conducting dielectric layer, typically a silicon nitride layer, sandwiched between two silicon dioxide layers (insulating layers). The nonconducting dielectric layer functions as an electrical charge trapping medium. A conducting gate layer is placed over the upper silicon dioxide layer. Since the electrical charge is trapped locally near whichever side that is used as the drain, this structure can be described as a two-transistor cell, or two-bits per cell. If multi-level is used, then four or more bits per cell can be accomplished. Multi-bit cells enable SONOS type memory devices to have the advantage over others in facilitating the continuing trend increasing the amount of information held/processed on an integrated circuit chip.

For simplicity, a two-bit per cell implementation of SONOS is described. While both bits of SONOS type memory devices are programmed in a conventional manner, such as using hot electron programming, each bit is read in a direction opposite that in which it is programmed with a relatively low gate voltage. For example, the right bit is programmed conventionally by applying programming voltages to the gate and the drain while the source is grounded or at a lower voltage. Hot electrons are accelerated sufficiently so that they are injected into a region of the trapping dielectric layer near the drain. The device, however, is read in the opposite direction from which it is written, meaning voltages are applied to the gate and the source while the drain is grounded or at a lower voltage. The left bit is similarly programmed and read by swapping the functionality of source and drain terminals. Programming one of the bits leaves the other bit with its information intact and undisturbed. Programming one of the bits does, however, have a very small effect on the other bit. See Shimoji U.S. Pat. No. 5,349,221 and Hayes U.S. Pat. No. 4,173,766.

In Shimoji U.S. Pat. No. 5,349,221, when positive high voltages are respectively applied to the gate and the drain region of a SONOS type memory cell and the source region is grounded, hot electrons are produced in the boundary between the drain region and the channel. The hot electrons are locally injected into an insulation film and trapped therein. Consequently, information is written. At the time of reading out information, the drain region is grounded, a positive read voltage is applied to the source region, and a predetermined sense voltage is applied to the gate.

Reading in the reverse direction is most effective when relatively low gate voltages are used. A benefit of utilizing relatively low gate voltages in combination with reading in the reverse direction is that the potential drop across the portion of the channel beneath the trapped charge region is significantly reduced. A relatively small programming region or charge trapping region is possible due to the lower channel potential drop under the charge trapping region. This permits much faster programming times because the effect of the charge trapped in the localized trapping region is amplified. Programming times are reduced while the delta in threshold voltage between the programmed versus unprogrammed states remains the same as when the device is read in the forward direction.

SONOS type memory devices offer additional advantages as well. In particular, the erase mechanism of the memory cell is greatly enhanced. Both bits of the memory cell can be erased by applying suitable erase voltages to the gate and the drain for the right bit and to the gate and the source for the left bit. Another advantage includes reduced wearout from cycling thus increasing device longevity. An effect of reading in the reverse direction is that a much higher threshold voltage for the same amount of programming is possible. Thus, to achieve a sufficient delta in the threshold voltage between the programmed and unprogrammed states of the memory cell, a much smaller region of trapped charge is required when the cell is read in the reverse direction than when the cell is read in the forward direction.

The erase mechanism is enhanced when the charge trapping region is made as narrow as possible. Programming in the forward direction and reading in the reverse direction permits limiting the width of the charge trapping region to a narrow region near the drain (right bit) or the source. This allows for much more efficient erasing of the memory cell.

Another advantage of localized charge trapping is that during erase, the region of the nitride away from the drain does not experience deep depletion since the erase occurs near the drain only. The final threshold of the cell after erasing is self limited by the device structure itself. This is in direct contrast to conventional single transistor floating gate flash memory cells which often have deep depletion problems.

Although many advantages are described above, there are at least two disadvantages associated with SONOS type memory devices. One disadvantage is that isolation by LOCOS (LOCal Oxidation of Silicon) takes up a relatively large amount of space. Given the continuing trend towards miniaturization and increased integration of devices on an integrated circuit chip, efficient utilization of space is of increasing importance. Isolation by LOCOS also causes undesirable outgassing of dopants.

Another disadvantage with SONOS type memory devices is that LOCOS formation causes short channeling. There are high temperatures associated with LOCOS formation, often from 800° C. to 1,100° C. Short channeling is a decrease in the effective channel length, often represented as $L_{eff}$. Unnecessarily decreasing the effective channel length results in an undesirably large current passing through the transistor at low gate voltages such as when the transistor is in the "off" state.

Thermal cycling associated with LOCOS formation also causes an increase in bitline to bitline punch-through leakage. That is, diffusion caused by thermal cycling leads to undesirable leakage between bitlines.

The SONOS type memory devices can be formed in the following manner. In Mitchell et al U.S. Pat. No. 5,168,334, EEPROM memory cells are formed with buried bitlines. The buried bitlines and bitline oxides are formed in the core region of the substrate prior to formation of the ONO dielectric. Alternatively, Mitchell et al forms EEPROM memory cells by forming an ONO dielectric, depositing polysilicon over the ONO dielectric, patterning the polysilicon, forming the buried bitlines, and removing the ONO dielectric covering the bitlines. In Eitan U.S. Pat. No. 5,966,603, an ONO dielectric is formed over the substrate, a bitline mask is patterned over the ONO dielectric in core while completely covering the periphery, portions of the top oxide and nitride layers left exposed by the bitline mask are etched/removed, the bitlines are implanted, then bitline oxides are formed over the bitlines. In Eitan PCT International Publication Number WO 99/60631, memory cells are formed by forming an ONO dielectric, a bitline mask with openings for the bitlines is formed over the ONO dielectric, the top oxide and nitride layers left exposed by the bitline mask are etched/removed, the bitlines are implanted, the bitline mask is removed, the exposed portions of the bottom oxide of the ONO dielectric are removed, gate oxides are grown including thick oxide growth over the bitlines, and polysilicon gates and wordlines are formed.

SUMMARY OF THE INVENTION

The present invention provides a simplified process for fabricating SONOS type nonvolatile memory devices, and in particular, a simplified process for forming buried bitlines in SONOS type nonvolatile memory devices. The SONOS type nonvolatile memory devices lead to the efficient production of dense, robust single-poly devices, having a substantially planar structure. Compared to conventional SONOS memory fabrication processes, the present invention eliminates the need for a core region etch step thus reducing costs and defect formation. The present invention eliminates high temperature thermal cycling associated with LOCOS formation in the core region, thereby minimizing and/or eliminating short channeling. The present invention also eliminates undesirable bird's beak associated with LOCOS formation which may lead to fewer defects and/or improved scaling. Another advantage is that in some instances the bitline implant does not experience the periphery gate oxide thermal cycle.

One aspect of the present invention relates to a method of forming a nonvolatile semiconductor memory device, involving the sequential or non-sequential steps of forming a charge trapping dielectric over a substrate, the substrate having a core region and a periphery region; removing at least a portion of the charge trapping dielectric in the periphery region; forming a gate dielectric in the periphery region; forming buried bitlines in the core region; and forming gates in the core region and the periphery region.

Another aspect of the present invention relates to a method of forming a non-volatile semiconductor memory device, involving the steps of forming a charge trapping dielectric over a substrate, the substrate having a core region and a periphery region; removing at least a portion of the charge trapping dielectric in the periphery region; forming a gate dielectric in the periphery region; forming buried bitlines in the core region; and forming gates in the core region and the periphery region.

Yet another aspect of the present invention relates to a method of forming a non-volatile semiconductor memory device, involving the steps of forming a charge trapping dielectric over a substrate, the substrate having a core region and a periphery region; forming buried bitlines in the core region; removing at least a portion of the charge trapping dielectric in the periphery region; forming a gate dielectric in the periphery region; and forming gates in the core region and the periphery region.

Still yet another aspect of the present invention relates to a method of forming a non-volatile semiconductor memory device, involving the steps of forming a charge trapping dielectric over a substrate, the substrate having a core region and a periphery region; removing at least a portion of the charge trapping dielectric in the periphery region; forming a gate dielectric having a first thickness in the periphery region; forming buried bitlines in the core region; increasing the thickness of the gate dielectric in at least a portion of the periphery region to provide a gate dielectric having a second thickness; and forming gates in the core region and the periphery region.

DISCLOSURE OF INVENTION

The present invention involves a process for fabricating SONOS type nonvolatile memory devices, and in particular, a simplified process for forming bitlines in SONOS type nonvolatile memory devices. The SONOS type memory cells of an array are coupled to wordlines and bitlines. In particular, the drains and the sources of the SONOS type memory cells are connected to the bitlines. Using peripheral decoders and control circuitry, each memory cell can be addressed for programming, reading or erasing functions. Formation of bitlines is therefore necessary to the operation of the SONOS type nonvolatile memory devices.

One aspect of the present invention involves a process for fabricating nonvolatile semiconductor memory devices that do not contain LOCOS in the core region. As a result, undesirable bird's beak and high temperature thermal cycling associated with LOCOS formation is minimized and/or eliminated. The processes of the present invention may also provide memory devices having substantially planar structures.

Figure 1:
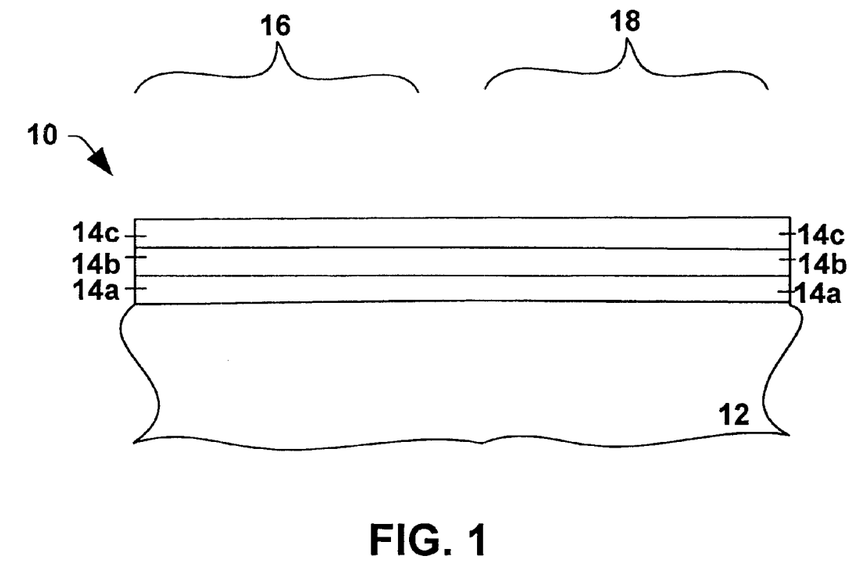
FIG. 1 illustrates a cross-sectional view of one aspect of a method in accordance with the present invention.

The present invention is now described with reference to the figures, wherein like features are referred to with like numbers throughout. One aspect of the present invention is described in FIGS. 1–6. Referring to FIG. 1, a semiconductor structure 10 is shown with a semiconductor substrate 12 under a charge trapping dielectric 14. Semiconductor structure 10 contains two regions, the core region 16 containing the memory cells and the periphery region 18 containing the rest of the chip such as the controlling logic and input/output devices. As shown the charge trapping dielectric 14 contains three layers; namely, a first silicon dioxide layer 14a, a silicon nitride layer 14b, and a second silicon dioxide layer 14c (an ONO dielectric). Particularly in the case of an ONO dielectric, the electron trapping is in the silicon nitride layer 14b.

The charge trapping dielectric 14, may be any dielectric layer or layers that are capable of or facilitate electron trapping. For example, charge trapping dielectrics include an ONO trilayer dielectric, an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilaye dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), an oxide/hafnium oxide/oxide trilayer dielectric, and the like (in each case, the first layer mentioned is the bottom layer while the last layer mentioned is the top layer). Although the term SONOS type nonvolatile memory device is often used herein, it is to be understood that a SONOS type nonvolatile memory device as used herein may contain any of the charge trapping dielectrics described above. In other words, a SONOS type nonvolatile memory device contains any dielectric layer or layers that are capable of or facilitate electron trapping, and the SONOS type nonvolatile memory device contains an ONO charge trapping dielectric only when a specific reference to such dielectric is indicated.

Moreover, in the embodiments where the charge trapping dielectric is an ONO dielectric, one or both of the silicon dioxide layers 14a and 14c may be a silicon-rich silicon dioxide layer. One or both of the silicon dioxide layers 14a and 14c may also be an oxygen-rich silicon dioxide layer. One or both of the silicon dioxide layers 14a and 14c may be a thermally grown or a deposited oxide. One or both of the silicon dioxide layers 14a and 14c may be nitrided oxide layers. The nitride 14b may be a silicon-rich silicon nitride layer. The nitride 14b may also be an nitrogen-rich silicon nitride layer. In one embodiment, the charge trapping dielectric 14 has a thickness from about 75 Å to about 300 Å. In another embodiment, the charge trapping dielectric 14 has a thickness from about 100 Å to about 275 Å. In yet another embodiment, the charge trapping dielectric 14 has a thickness from about 110 Å to about 250 Å.

In this connection, in one embodiment, the oxide layers 14a and 14c individually have thicknesses from about 50 Å to about 150 Å while the nitride layer 14b has a thickness from about 20 Å to about 80 Å. In another embodiment, the oxide layers 14a and 14c individually have thicknesses from about 60 Å to about 140 Å while the nitride layer 14b has a thickness from about 25 Å to about 75 Å. In yet another embodiment, the oxide layers 14a and 14c individually have thicknesses from about 70 Å to about 130 Å while the nitride layer 14b has a thickness from about 30 Å to about 70 Å.

Although not shown, a threshold implant ($V_T$ adjustment implant) step may be conducted before formation of the charge trapping dielectric 14 over the structure. For example, a blanket implantation of boron may be performed just prior to forming the charge trapping dielectric 14. As explained below, this implantation step may be conducted before or after the bitline implantation step.

Figure 2:
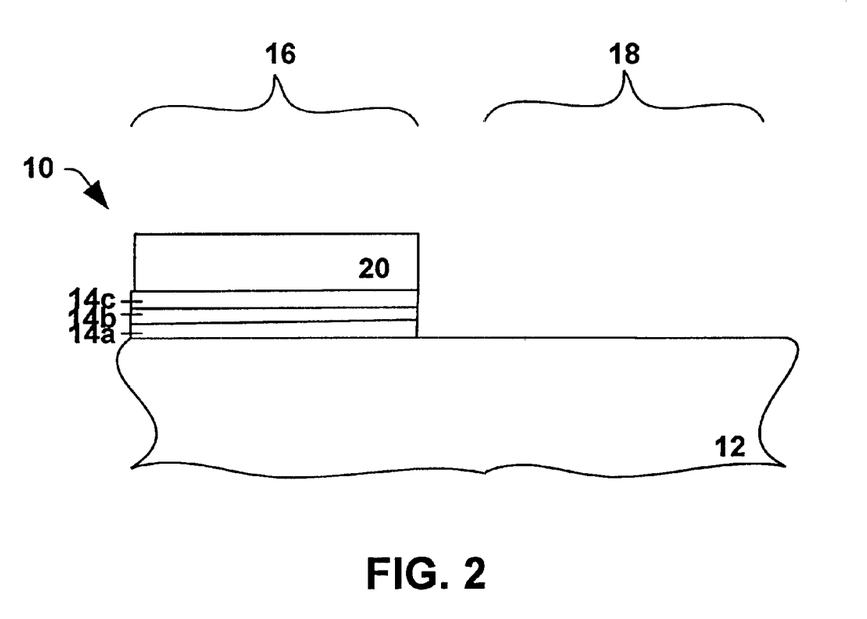
FIG. 2 illustrates a cross-sectional view of another aspect of a method in accordance with the present invention.

Referring to FIG. 2, a mask such as a suitable photoresist 20 is used to cover the charge trapping dielectric 14 in the core region 16 leaving the charge trapping dielectric 14 exposed in the periphery region 18 of the structure 10. The charge trapping dielectric 14 exposed in the periphery region 18 is etched down to the substrate 12 (the first silicon dioxide layer 14a, the silicon nitride layer 14b, and the second silicon dioxide layer 14c are removed in the periphery region 18 of the structure 10). Multiple etching steps may be employed to remove the charge trapping dielectric 14.

Figure 3:
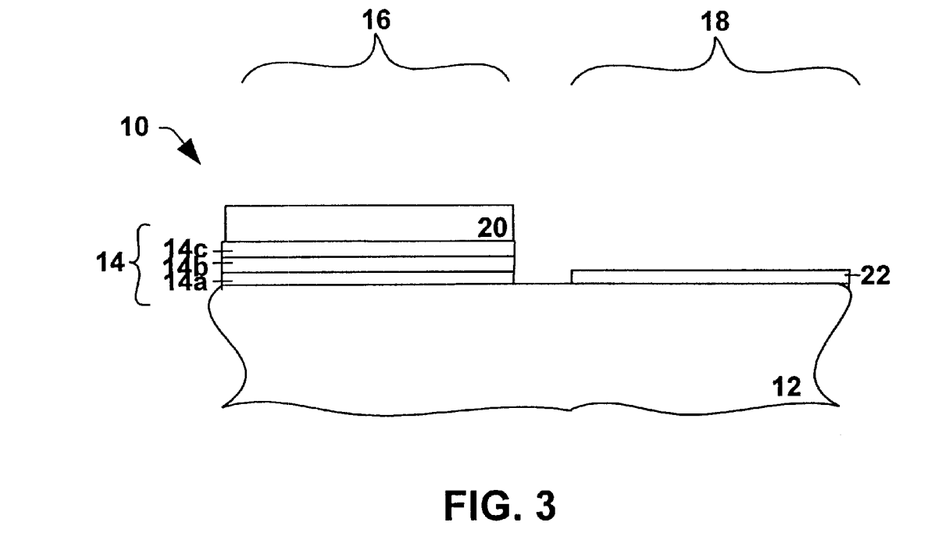
FIG. 3 illustrates a cross-sectional view of yet another aspect of a method in accordance with the present invention.

Referring to FIG. 3, a gate dielectric 22 such as an oxide layer is provided using any suitable means, such as chemical vapor deposition (CVD), dry oxidation, wet oxidation or rapid thermal oxidation, on at least a portion of the exposed portions of the substrate 12 (over the periphery region 18). Dry oxidation, wet oxidation, and rapid thermal oxidation are preferred, especially when gate dielectric 22 contains silicon dioxide. CVD techniques are employed in instances where the gate dielectric 22 contains one or more of silicon dioxide, silicon nitride, and silicon oxynitride.

The gate dielectric 22 later serves as the gate dielectric for subsequently formed high and/or low voltage transistors (not shown) in the periphery region 18. In one embodiment, the gate dielectric 22 has a thickness from about 30 Å to about 300 Å. In another embodiment, the gate dielectric 22 has a thickness from about 40 Å to about 250 Å. Before or after formation of gate dielectric 22, photoresist 20 is stripped or removed from the semiconductor structure 10.

Figure 4:
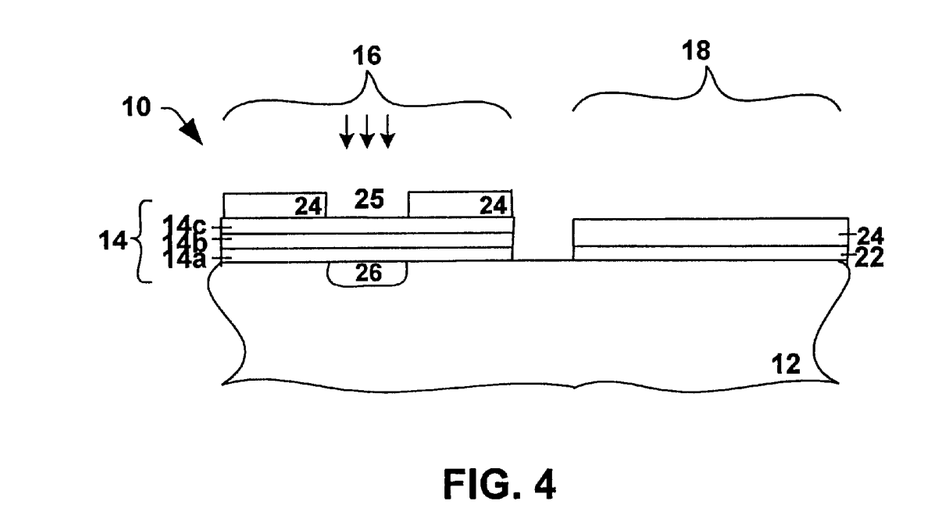
FIG. 4 illustrates a cross-sectional view of still yet another aspect of a method in accordance with the present invention.

Referring to FIG. 4, another mask such as a suitable photoresist 24 is used to partially cover the charge trapping dielectric 14 in the core region 16 while covering the gate dielectric 22 in the periphery region 18 of the structure 10. In the core region 16, photoresist 24 is patterned such that there are openings 25 therein. The photoresist 24 is patterned in the core region 16 to facilitate/correspond to the formation of the buried bitlines (that is, areas of the charge trapping dielectric 14 directly over the subsequently formed buried bitlines are exposed by the patterned photoresist 24). Ions are implanted, as shown by the arrows, forming implanted region 26 directly below opening 25. The semiconductor structure 10 is optionally annealed at a suitable temperature after implantation.

One or more suitable implantation materials may be employed. The selection of implantation materials primarily depends on the type of substrate employed, for example, whether a p-type or n-type is used (p+, p−, n+, or n−). Examples of implantation materials include one or more of arsenic, boron, and phosphorus. In one embodiment, an n+ dopant is employed for implantation. In another embodiment, a p+ dopant is employed for implantation. Implantation is conducted to achieve a suitable dosage.

The implantation materials are implanted at a dosage suitable to form buried bitlines. In one embodiment, the implantation materials are implanted at a dosage from about $1 \times 10^{14}$ to about $1 \times 10^{16}$ atoms/cm$^2$. In another embodiment, the implantation materials are implanted at a dosage from about $5 \times 10^{14}$ to about $7 \times 10^{15}$ atoms/cm$^2$. In yet another embodiment, the implantation materials are implanted at a dosage from about $1 \times 10^{15}$ to about $5 \times 10^{15}$ atoms/cm$^2$.

Implanted regions 26, which correspond to the openings 25, form the buried bitlines in the resultant SONOS type nonvolatile memory device. The width of the implanted regions 26 at least substantially correspond to the width of the openings 25. In one embodiment, the width of the implanted regions 26 (and the subsequently formed bitlines) is from about 0.15 μm to about 1.5 μm. In another embodiment, the width of the implanted regions 26 (and the subsequently formed bitlines) is from about 0.18 μm to about 1 μm. In yet another embodiment, the width of the implanted regions 26 (and the subsequently formed bitlines) is from about 0.2 μm to about 0.75 μm.

Although not shown, a $V_T$ adjustment implant step may optionally be conducted before or after the bitline implantation step. For example, the structure 10 may be tilted relative to the angle of implantation and implantation of boron may occur through openings 25 in the photoresist 24 in the core region 16 to form implanted regions (not shown) adjacent implanted regions 26. The $V_T$ adjustment implant step typically employs a type dopant opposite that of the bitline implantation species.

Figure 5:
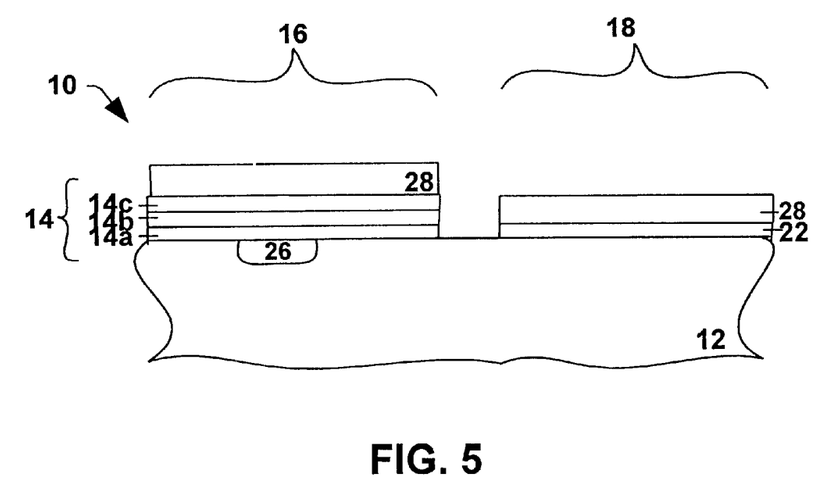
FIG. 5 illustrates a cross-sectional view of another aspect of a method in accordance with the present invention.

Referring to FIG. 5, patterned photoresist 24 is removed from the structure 10, and polysilicon gates 28 are formed over the structure 10. In particular, after the photoresist 24 is stripped, polysilicon (or doped amorphous silicon) is deposited over the charge trapping dielectric 14 in the core region 16 and the gate dielectric 22 in the periphery region 18 by suitable techniques. In one embodiment, the polysilicon layer has a thickness (over the charge trapping dielectric 14) from about 500 Å to about 6,000 Å. In another embodiment, the polysilicon layer has a thickness from about 1,000 Å to about 5,000 Å. In yet another embodiment, the polysilicon layer has a thickness from about 1,500 Å to about 4,000 Å. The polysilicon layer is then patterned using suitable techniques to form polysilicon gates 28. For example, a photoresist (not shown) may be deposited and patterned using standard lithographic techniques covering a portion and exposing a portion of the polysilicon layer. The exposed portions of the polysilicon layer are removed by standard techniques, such as using anisotropic etching.

Although not shown, when the polysilicon gates 28 are formed over the structure 10, further processing is performed to complete the fabrication of SONOS type flash memory devices. For example, periphery source/drain regions and gates are doped, spacers are formed, salicidation, completion of formation of SONOS type flash memory cells, select gates, high voltage gates, and low voltage gates, and so on. The gates in the core region and the periphery region may be formed simultaneously or at different times. For example, gates may be initially formed in the core region and later formed in the periphery region or initially formed in the periphery region and later formed in the core region. Moreover, individual gates may be formed simultaneously or at different times within each of the periphery and core regions.

Figure 6:
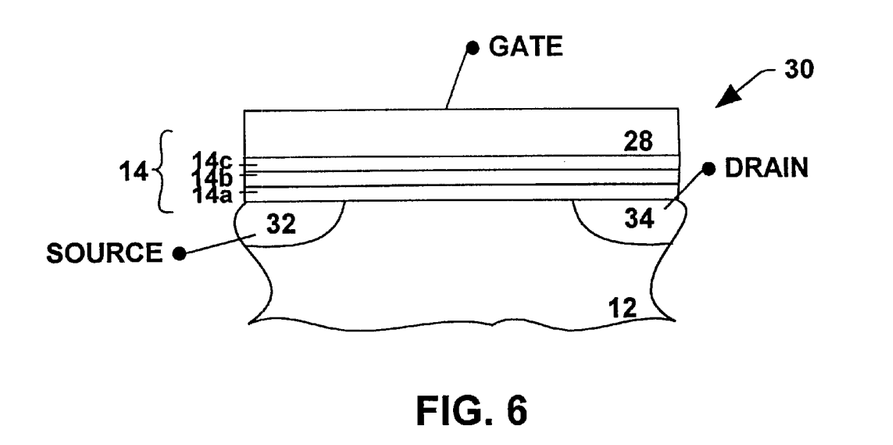
FIG. 6 illustrates a cross-sectional view of a SONOS type memory cell in accordance with one aspect of the invention.

Referring to FIG. 6, a SONOS type memory cell 30 formed in the core region of a SONOS type memory device is shown. The cell contains charge trapping dielectric 14, gate 28, source 32, and drain 34. SONOS type memory cell 30 can function and operate as a single bit cell or a double bit cell.

Figure 7:
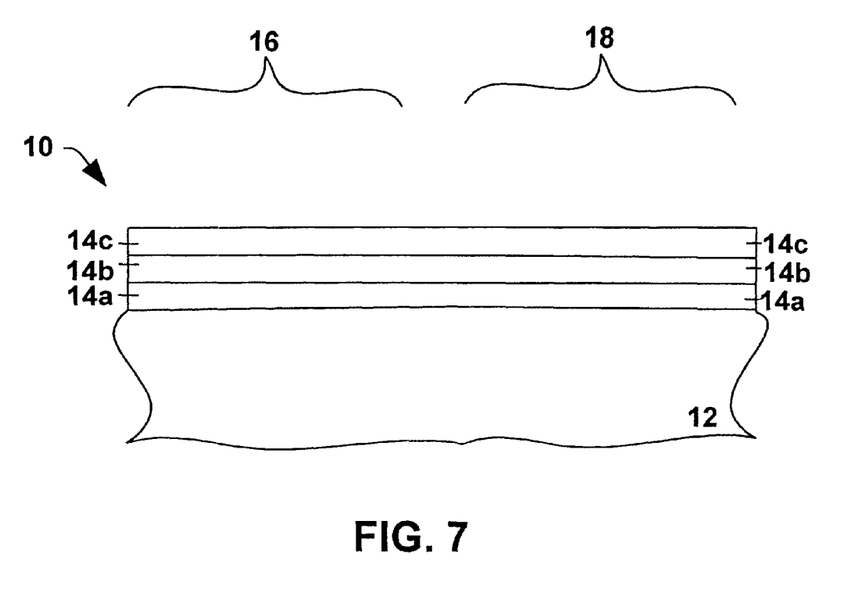
FIG. 7 illustrates a cross-sectional view of one aspect of another method in accordance with the present invention.

Another aspect of the present invention is described in FIGS. 7–12. Referring to FIG. 7, a semiconductor structure 10 is shown with a semiconductor substrate 12 under a charge trapping dielectric 14. Semiconductor structure 10 contains two regions, the core region 16 containing the memory cells and the periphery region 18 containing the rest of the chip such as the controlling logic and input/output devices. As shown, the charge trapping dielectric 14 contains three layers; namely, a first silicon dioxide layer 14a, a silicon nitride layer 14b, and a second silicon dioxide layer 14c (an ONO dielectric). Particularly in the case of an ONO dielectric, the electron trapping is in the silicon nitride layer 14b.

The charge trapping dielectric 14, may be any dielectric layer or layers that are capable of or facilitate electron trapping. For example, charge trapping dielectrics include an ONO trilayer dielectric, an oxide/nitride bilayer dielectric, a nitride/oxide bilayer dielectric, an oxide/tantalum oxide bilayer dielectric, an oxide/tantalum oxide/oxide trilayer dielectric, an oxide/strontium titanate bilayer dielectric, an oxide/barium strontium titanate bilayer dielectric, an oxide/strontium titanate/oxide trilayer dielectric, an oxide/ strontium titanate/barium strontium titanate trilayer dielectric, an oxide/hafnium oxide/oxide trilayer dielectric, and the like.

Moreover, in the embodiments where the charge trapping dielectric is an ONO dielectric, one or both of the silicon dioxide layers 14a and 14c may be a silicon-rich silicon dioxide layer. One or both of the silicon dioxide layers 14a and 14c may also be an oxygen-rich silicon dioxide layer. One or both of the silicon dioxide layers 14a and 14c may be a thermally grown or a deposited oxide. One or both of the silicon dioxide layers 14a and 14c may be nitrided oxide layers. The nitride 14b may be a silicon-rich silicon nitride layer. The nitride 14b may also be an nitrogen-rich silicon nitride layer.

Although not shown, a threshold implant ($V_T$ adjustment implant) step may be conducted before formation of the charge trapping dielectric 14 over the structure. For example, a blanket implantation of boron may be performed just prior to forming the charge trapping dielectric 14. As explained below, this implantation step may be conducted before or after the bitline implantation step.

Figure 8:
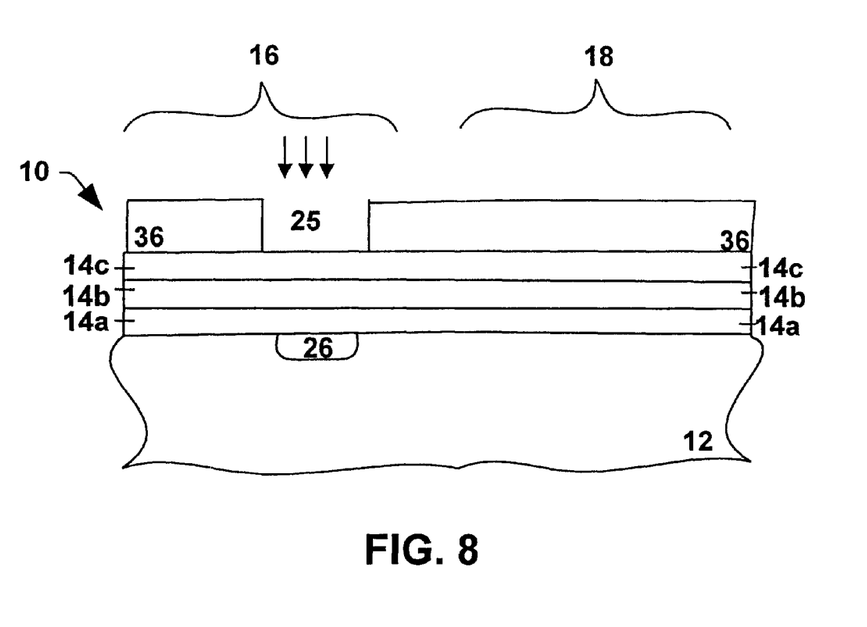
FIG. 8 illustrates a cross-sectional view of another aspect of another method in accordance with the present invention.

Referring to FIG. 8, a mask such as a suitable photoresist 36 is used to partially cover the charge trapping dielectric 14 in the core region 16 while covering the charge trapping dielectric 14 in the periphery region 18 of the structure 10. In the core region 16, photoresist 36 is patterned such that there are openings 25 therein. The photoresist 36 is patterned in the core region 16 to facilitate/correspond to the formation of the buried bitlines (that is, areas of the charge trapping dielectric 14 directly over the subsequently formed buried bitlines are exposed by the patterned photoresist 36). Ions are implanted, as shown by the arrows, forming implanted region 26 directly below opening 25. The semiconductor structure 10 is optionally annealed at a suitable temperature after implantation.

One or more suitable implantation materials may be employed. The selection of implantation materials primarily depends on the type of substrate employed, for example, whether a p-type or n-type is used (p+, p−, n+, or n−). Examples of implantation materials include one or more of arsenic, boron, and phosphorus.

The implantation materials are implanted at a dosage suitable to form buried bitlines. In one embodiment, the implantation materials are implanted at a dosage from about $1\times10^{14}$ to about $1\times10^{16}$ atoms/cm$^2$. In another embodiment, the implantation materials are implanted at a dosage from about $5\times10^{14}$ to about $7\times10^{15}$ atoms/cm$^2$. In yet another embodiment, the implantation materials are implanted at a dosage from about $1\times10^{15}$ to about $5\times10^{15}$ atoms/cm$^2$.

Implanted regions 26, which correspond to the openings 25, form the buried bitlines in the resultant SONOS type nonvolatile memory device. The width of the implanted regions 26 at least substantially correspond to the width of the openings 25.

Although not shown, a $V_T$ adjustment implant step may optionally be conducted before or after the bitline implantation step. For example, the structure 10 may be tilted relative to the angle of implantation and implantation of boron may occur through openings 25 in the photoresist 36 in the core region 16 to form implanted regions (not shown) adjacent implanted regions 26. The $V_T$ adjustment implant step typically employs a type dopant opposite that of the bitline implantation species.

Figure 9:
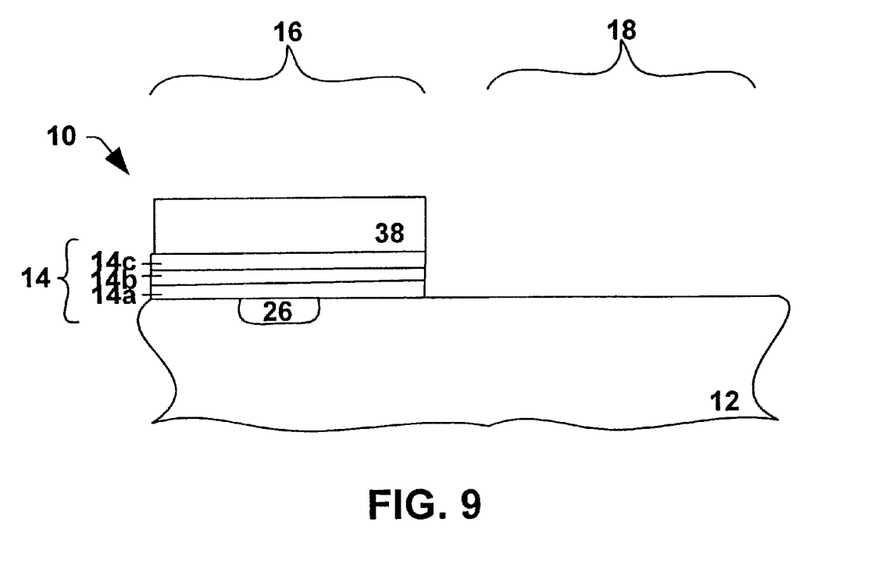
FIG. 9 illustrates a cross-sectional view of yet another aspect of another method in accordance with the present invention.

Referring to FIG. 9, photoresist 36 is stripped or removed from the structure 10 and another mask such as a suitable photoresist 38 is used to cover the charge trapping dielectric 14 in the core region 16 leaving the charge trapping dielectric 14 exposed in the periphery region 18 of the structure 10. The charge trapping dielectric 14 exposed in the periphery region 18 is etched down to the substrate 12 (the first silicon dioxide layer 14a, the silicon nitride layer 14b, and the second silicon dioxide layer 14c are removed in the periphery region 18 of the structure 10). Multiple etching steps may be employed to remove the charge trapping dielectric 14.

Figure 10:
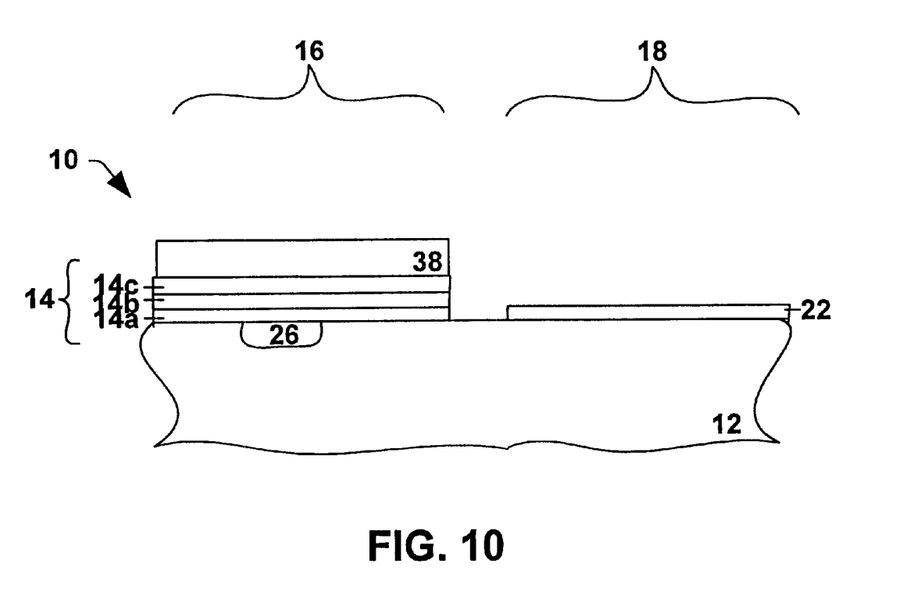
FIG. 10 illustrates a cross-sectional view of still yet another aspect of another method in accordance with the present invention.

Referring to FIG. 10, a gate dielectric 22 such as an oxide layer is provided using any suitable means, such as CVD, dry oxidation, wet oxidation or rapid thermal oxidation, on at least a portion of the exposed portions of the substrate 12 (over the periphery region 18). Dry oxidation, wet oxidation, and rapid thermal oxidation are preferred, especially when gate dielectric 22 contains silicon dioxide. CVD techniques are employed in instances where the gate dielectric 22 contains one or more of silicon dioxide, silicon nitride, and silicon oxynitride.

The gate dielectric 22 later serves as the gate dielectric for subsequently formed high and/or low voltage transistors (not shown) in the periphery region 18. In one embodiment, the gate dielectric 22 has a thickness from about 30 Å to about 300 Å. In another embodiment, the gate dielectric 22 has a thickness from about 40 Å to about 250 Å. Before or after formation of gate dielectric 22, photoresist 38 is stripped or removed from the semiconductor structure 10.

Figure 11:
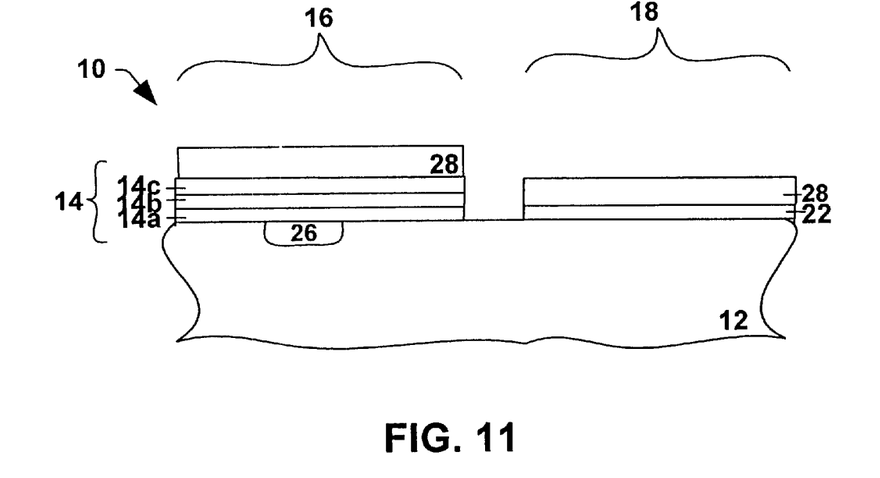
FIG. 11 illustrates a cross-sectional view of another aspect of another method in accordance with the present invention.

Referring to FIG. 11, patterned photoresist 38 is removed from the structure 10, and polysilicon gates 28 are formed over the structure 10. In particular, after the photoresist 38 is stripped, polysilicon (or doped amorphous silicon) is deposited over the charge trapping dielectric 14 in the core region 16 and the gate dielectric 22 in the periphery region 18 by suitable techniques. The polysilicon layer is then patterned using suitable techniques to form polysilicon gates 28. For example, a photoresist (not shown) may be deposited and patterned using standard lithographic techniques covering a portion and exposing a portion of the polysilicon layer. The exposed portions of the polysilicon layer are removed by standard techniques, such as using anisotropic etching.

Although not shown, when the polysilicon gates 28 are formed over the structure 10, further processing is performed to complete the fabrication of SONOS type flash memory devices.

Figure 12:
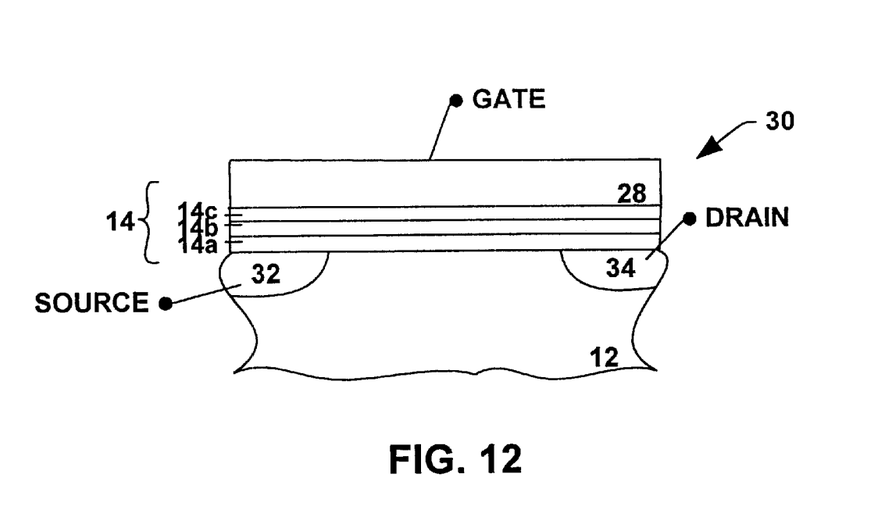
FIG. 12 illustrates a cross-sectional view of a SONOS type memory cell in accordance with another aspect of the invention.

Referring to FIG. 12, a SONOS type memory cell 30 formed in the core region of a SONOS type memory device is shown. The cell contains charge trapping dielectric 14, gate 28, source 32, and drain 34. SONOS type memory cell 30 can function and operate as a single bit cell or a double bit cell.

Figure 13:
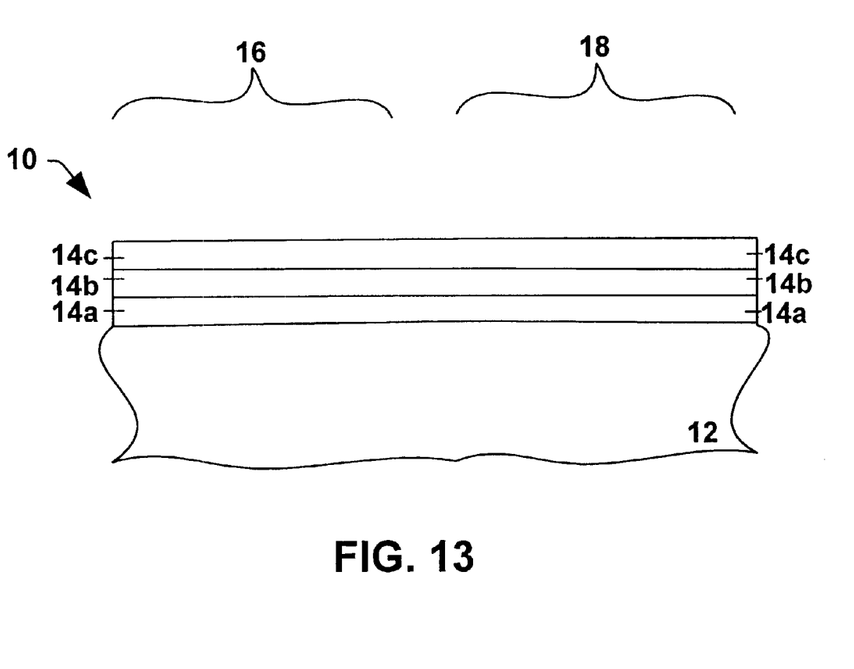
FIG. 13 illustrates a cross-sectional view of one aspect of yet another method in accordance with the present invention.

One aspect of the present invention is described in FIGS. 13–19. Referring to FIG. 13, a semiconductor structure 10 is shown with a semiconductor substrate 12 under a charge trapping dielectric 14. Semiconductor structure 10 contains two regions, the core region 16 containing the memory cells and the periphery region 18 containing the rest of the chip such as the controlling logic and input/output devices. As shown, the charge trapping dielectric 14 contains three layers; namely, a first silicon dioxide layer 14a, a silicon nitride layer 14b, and a second silicon dioxide layer 14c (an ONO dielectric). Particularly in the case of an ONO dielectric, the electron trapping is in the silicon nitride layer 14b.

The charge trapping dielectric 14, may be any dielectric layer or layers that are capable of or facilitate electron trapping. For example, charge trapping dielectrics include an ONO trilayer dielectric, an oxide/nitride bilayer dielectric, a nitride/oxide bilayer dielectric, an oxide/tantalum oxide bilayer dielectric, an oxide/tantalum oxide/oxide trilayer dielectric, an oxide/strontium titanate bilayer dielectric, an oxide/barium strontium titanate bilayer dielectric, an oxide/strontium titanate/oxide trilayer dielectric, an oxide/strontium titanate/barium strontium titanate trilayer dielectric, an oxide/hafnium oxide/oxide trilayer dielectric, and the like.

Moreover, in the embodiments where the charge trapping dielectric is an ONO dielectric, one or both of the silicon dioxide layers 14a and 14c may be a silicon-rich silicon dioxide layer. One or both of the silicon dioxide layers 14a and 14cmay also be an oxygen-rich silicon dioxide layer. One or both of the silicon dioxide layers 14a and 14c may be a thermally grown or a deposited oxide. One or both of the silicon dioxide layers 14a and 14c may be nitrided oxide layers. The nitride 14b may be a silicon-rich silicon nitride layer. The nitride 14b may also be an nitrogen-rich silicon nitride layer.

Although not shown, a threshold implant ($V_T$ adjustment implant) step may be conducted before formation of the charge trapping dielectric 14 over the structure. For example, a blanket implantation of boron may be performed just prior to forming the charge trapping dielectric 14. As explained below, this implantation step may be conducted before or after the bitline implantation step.

Figure 14:
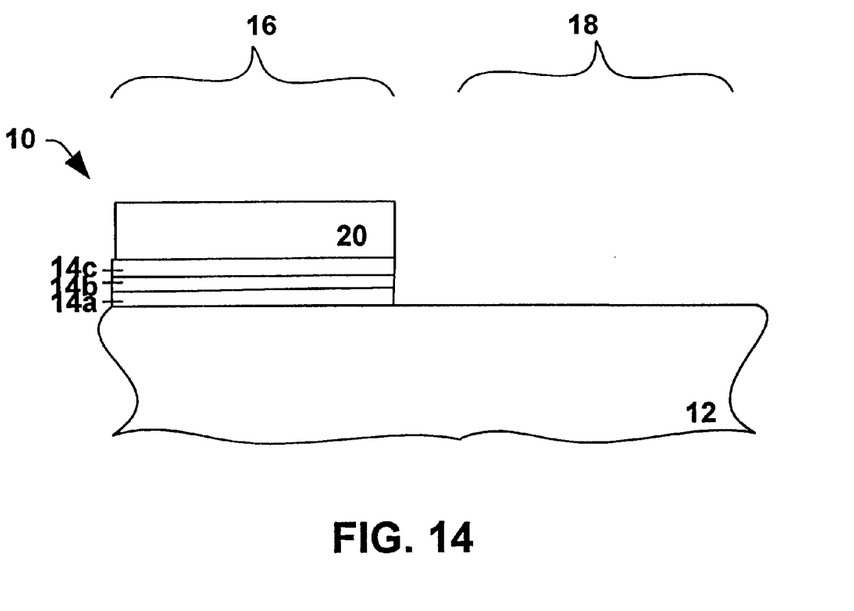
FIG. 14 illustrates a cross-sectional view of another aspect of yet another method in accordance with the present invention.

Referring to FIG. 14, a mask such as a suitable photoresist 20 is used to cover the charge trapping dielectric 14 in the core region 16 leaving the charge trapping dielectric 14 exposed in the periphery region 18 of the structure 10. The charge trapping dielectric 14 exposed in the periphery region 18 is etched down to the substrate 12 (the first silicon dioxide layer 14a, the silicon nitride layer 14b, and the second silicon dioxide layer 14c are removed in the periphery region 18 of the structure 10). Multiple etching steps may be employed to remove the charge trapping dielectric 14.

Figure 15:
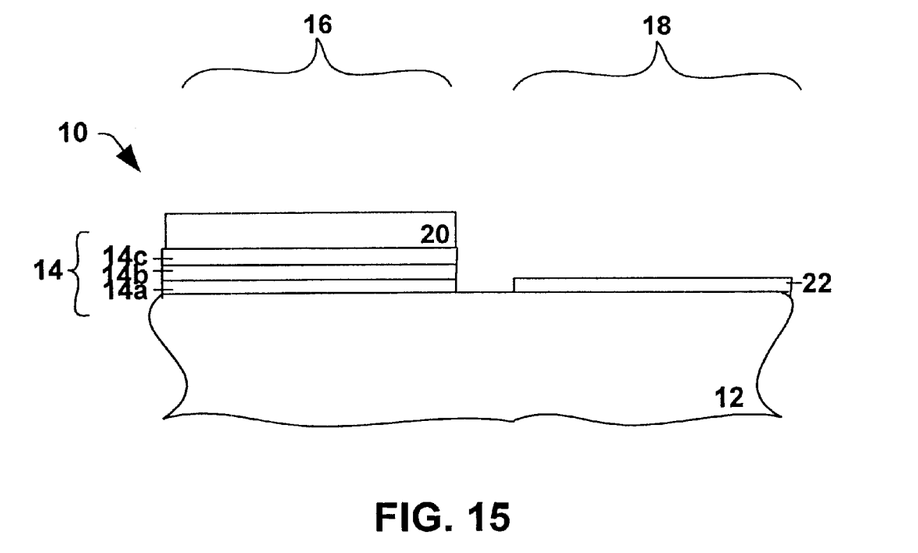
FIG. 15 illustrates a cross-sectional view of yet another aspect of yet another method in accordance with the present invention.

Referring to FIG. 15, a gate dielectric 22 such as an oxide layer is provided using any suitable means, such as dry oxidation, wet oxidation, rapid thermal oxidation, or CVD, on at least a portion of the exposed portions of the substrate 12 (over the periphery region 18). Dry oxidation, wet oxidation, and rapid thermal oxidation are preferred, especially when gate dielectric 22 contains silicon dioxide. CVD techniques may be employed in instances where the gate dielectric 22 contains one or more of silicon dioxide, silicon nitride, and silicon oxynitride.

The gate dielectric 22 later serves as the gate dielectric for subsequently formed high and/or low voltage transistors (not shown) in the periphery region 18. In one embodiment, the gate dielectric 22 has a thickness from about 30 Å to about 300 Å. In another embodiment, the gate dielectric 22 has a thickness from about 40 Å to about 250 Å. Before or after formation of gate dielectric 22, photoresist 20 is stripped or removed from the semiconductor structure 10.

Figure 16:
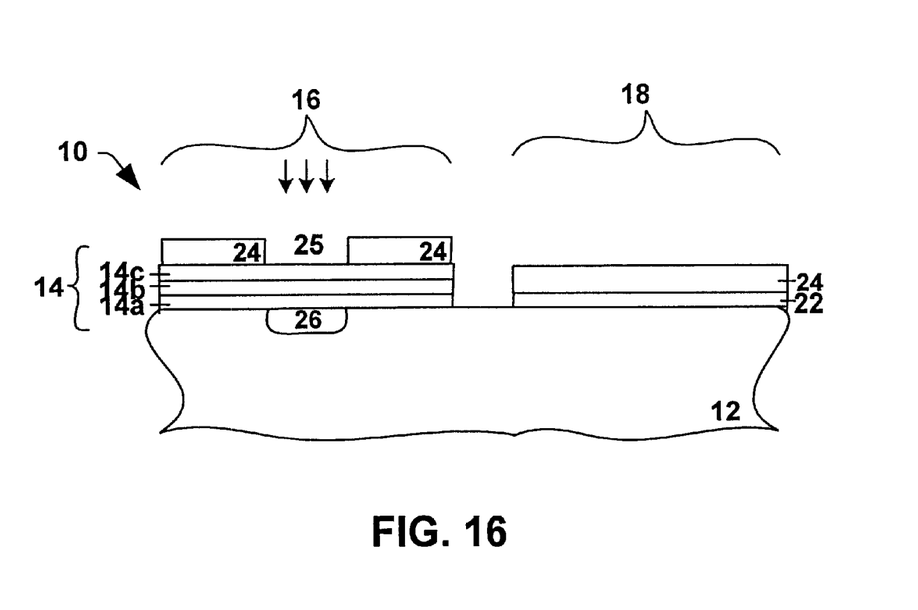
FIG. 16 illustrates a cross-sectional view of still yet another aspect of yet another method in accordance with the present invention.

Referring to FIG. 16, another mask such as a suitable photoresist 24 is used to partially cover the charge trapping dielectric 14 in the core region 16 while covering the gate dielectric 22 in the periphery region 18 of the structure 10. In the core region 16, photoresist 24 is patterned such that there are openings 25 therein. The photoresist 24 is patterned in the core region 16 to facilitate/correspond to the formation of the buried bitlines (that is, areas of the charge trapping dielectric 14 directly over the subsequently formed buried bitlines are exposed by the patterned photoresist 24).

Ions are implanted, as shown by the arrows, forming implanted region 26 in the substrate 12 directly below opening 25. The semiconductor structure 10 is optionally annealed at a suitable temperature after implantation.

One or more suitable implantation materials may be employed. The selection of implantation materials primarily depends on the type of substrate employed, for example, whether a p-type or n-type is used (p+, p−, n+, or n−). Examples of implantation materials include one or more of arsenic, boron, and phosphorus.

The implantation materials are implanted at a dosage suitable to form buried bitlines. In one embodiment, the implantation materials are implanted at a dosage from about $1 \times 10^{14}$ to about $1 \times 10^{16}$ atoms/cm$^2$. In another embodiment, the implantation materials are implanted at a dosage from about $5 \times 10^{14}$ to about $7 \times 10^{15}$ atoms/cm$^2$. In yet another embodiment, the implantation materials are implanted at a dosage from about $1 \times 10^{15}$ to about $5 \times 10^{15}$ atoms/cm$^2$.

Implanted regions 26, which correspond to the openings 25, form the buried bitlines in the resultant SONOS type nonvolatile memory device. The width of the implanted regions 26 at least substantially correspond to the width of the openings 25.

Although not shown, a $V_T$ adjustment implant step may optionally be conducted before or after the bitline implantation step. For example, the structure 10 may be tilted relative to the angle of implantation and implantation of boron may occur through openings 25 in the photoresist 24 in the core region 16 to form implanted regions (not shown) adjacent implanted regions 26. The $V_T$ adjustment implant step typically employs a type dopant opposite that of the bitline implantation species.

Figure 17:
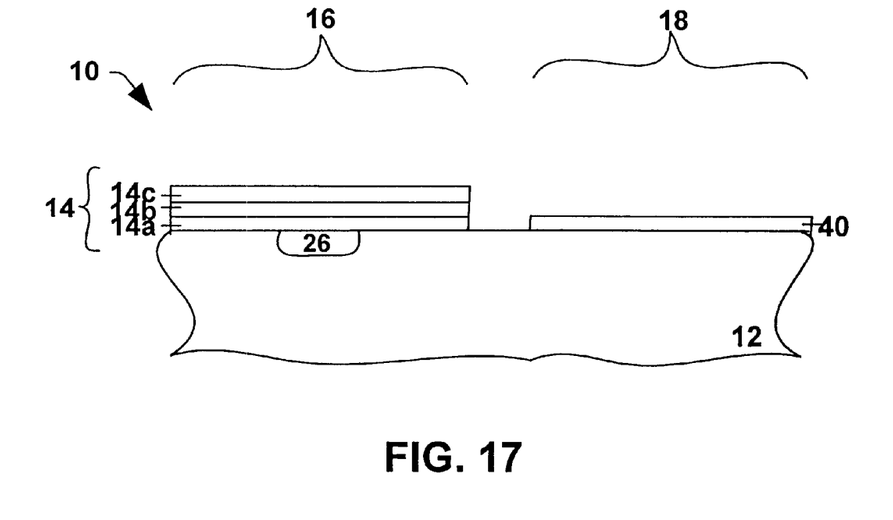
FIG. 17 illustrates a cross-sectional view of another aspect of yet another method in accordance with the present invention.

Referring to FIG. 17, patterned photoresist 24 is removed from the structure 10, and additional gate dielectric material is formed in the periphery region 18 thereby providing a size enhanced (increased thickness) and/or cleaner gate dielectric 40. The additional gate dielectric material is preferably formed by thermal growth versus deposition, using any suitable means, such as dry oxidation, wet oxidation or rapid thermal oxidation, although CVD techniques may be employed. Dry oxidation, wet oxidation, and rapid thermal oxidation are preferred, especially when gate dielectric 40 contains silicon dioxide. In instances where the entire structure is subject to the oxidation treatment, the presence of the silicon nitride layer 14b substantially impedes the growth of oxide in the silicon dioxide layer 14c of the core region 16. CVD techniques are employed in instances where the gate dielectric 40 contains one or more of silicon dioxide, silicon nitride, and silicon oxynitride. In instances where CVD techniques are employed, it is preferable to mask the core region (not shown).

The growth or regrowth of additional periphery gate dielectric material serves to provide a cleaner gate dielectric over which to subsequently form gates and/or increase the thickness of the gate dielectrics in the periphery region 18. Forming the gate dielectric 40 in two steps contributes to a reduction in unwanted diffusion of the bitline implants. In one embodiment, the size enhanced gate dielectric 40 has a thickness from about 30 Å to about 350 Å. In another embodiment, the size enhanced gate dielectric 40 has a thickness from about 40 Å to about 300 Å. In yet another embodiment, the size enhanced gate dielectric 40 has a thickness that is at least about 10% larger than the thickness of gate dielectric 22.

Although not shown, in some instances, a portion of the gate dielectric 22 in the periphery region 18 may be removed (using, for example, lithographic techniques) leaving the periphery region 18 partially covered by the gate dielectric 22 when the growth or regrowth of additional periphery gate dielectric material is conducted. In these instances, the remaining portion of the gate dielectric 22 is formed into the size enhanced gate dielectric, while fresh gate dielectric is formed in the portions where the gate dielectric 22 is previously removed. This is advantageous when different subsequently formed gates in the periphery region 18 require gate dielectrics of different thickness. For instance, high voltage gate transistors may require thicker gate oxides than low voltage gate transistors. In these instances, the size enhanced gate dielectric 40 may have two or more thicknesses. The growth or regrowth of additional periphery gate dielectric material is therefore conducted in one or more steps, two or more steps, etc.

Figure 18:
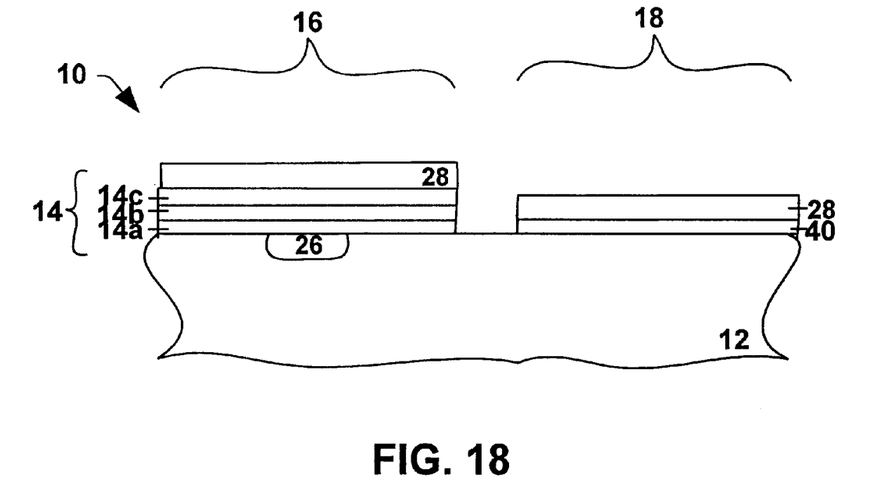
FIG. 18 illustrates a cross-sectional view of another aspect of yet another method in accordance with the present invention.

Referring to FIG. 18, polysilicon gates 28 are formed over the structure 10. In particular, polysilicon (or doped amorphous silicon) is deposited over the charge trapping dielectric 14 in the core region 16 and the size enhanced gate dielectric 40 (increased thickness) in the periphery region 18 by suitable techniques. The polysilicon layer is then patterned using suitable techniques to form polysilicon gates 28. For example, a photoresist (not shown) may be deposited and patterned using standard lithographic techniques covering a portion and exposing a portion of the polysilicon layer. The exposed portions of the polysilicon layer are removed by standard techniques, such as using anisotropic etching.

Although not shown, when the polysilicon gates 28 are formed over the structure 10, further processing is performed to complete the fabrication of SONOS type flash memory devices.

Figure 19:
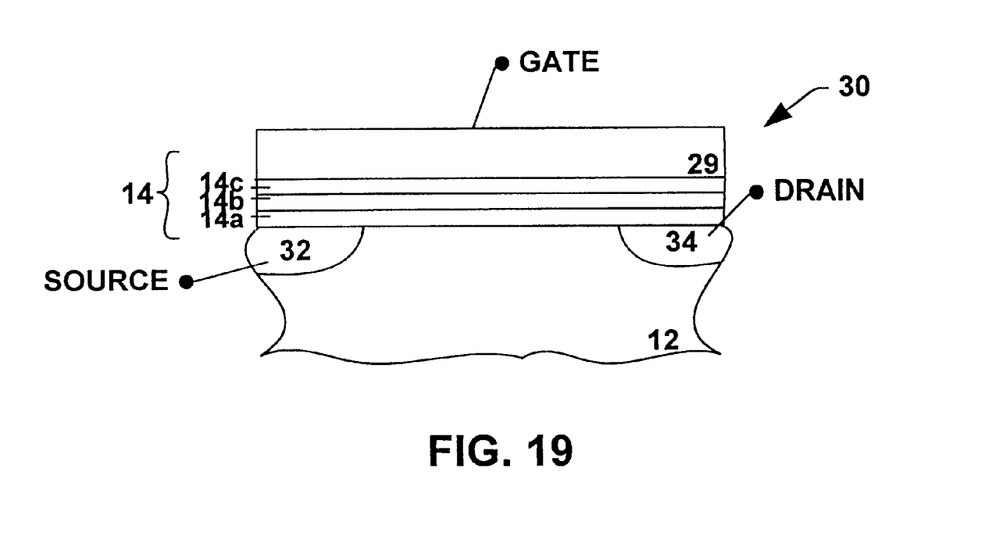
FIG. 19 illustrates a cross-sectional view of a SONOS type memory cell in accordance with yet another aspect of the invention.

Referring to FIG. 19, a SONOS type memory cell 30 formed in the core region of a SONOS type memory device is shown. The cell contains charge trapping dielectric 14, gate 29, source 32, and drain 34. SONOS type memory cell 30 can function and operate as a single bit cell or a double bit cell.

Typically when a semiconductor device is scaled, the channel lengths become shorter and short channel effects take hold. Thus, in the case of two bit memory cell, because each bit is stored in different areas of the transistor, short channel effects may become prevalent sooner than in the case of the single bit transistor. However, in the SONOS type memory devices of the present invention, short channeling effects are minimized, since there is no LOCOS in the core region.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a non-volatile semiconductor memory device, comprising:
   forming a charge trapping dielectric over a substrate, the substrate having a core region and a periphery region;
   removing at least a portion of the charge trapping dielectric in the periphery region with a proviso that the charge trapping dielectric is not etched in the core region;
   forming a gate dielectric in the periphery region;
   forming buried bitlines in the core region; and
   forming gates in the core region and the periphery region, with a proviso that LOCOS is not formed in the core region.

2. The method according to claim 1, wherein a portion of the charge trapping dielectric in the periphery region is removed before forming buried bitlines in the core region.

3. The method according to claim 1, wherein buried bitlines are formed in the core region before removing the portion of the charge trapping dielectric in the periphery region.

4. The method according to claim 1, wherein the gate dielectric is formed in the periphery region before forming buried bitlines in the core region.

5. The method according to claim 1, wherein buried bitlines are formed in the core region before forming the gate dielectric in the periphery region.

6. A method of forming a non-volatile semiconductor memory device, comprising sequentially:
   forming a charge trapping dielectric over a substrate, the substrate having a core region and a periphery region;
   removing at least a portion of the charge trapping dielectric in the periphery region;
   forming a gate dielectric in the periphery region;
   forming buried bitlines in the core region; and
   forming gates in the core region and the periphery region, with a proviso that LOCOS is not formed in the core region.

7. The method according to claim 6, wherein the charge trapping dielectric has a thickness from about 75 Å to about 300 Å.

8. The method according to claim 6, wherein the buried bitlines are formed by implanting at least one of arsenic, boron, and phosphorus.

9. The method according to claim 6, wherein the gate dielectric in the periphery region has a thickness from about 30 Å to about 300 Å.

10. The method according to claim 8, wherein at least one of arsenic, boron, and phosphorus are implanted at a dosage from about $1 \times 10^{14}$ to about $1 \times 10^{16}$ atoms/cm$^2$.

11. The method according to claim 6, wherein the charge trapping dielectric comprises one of an ONO trilayer dielectric, an oxide/nitride bilayer dielectric, a nitride/oxide bilayer dielectric, an oxide/tantalum oxide bilayer dielectric, an oxide/tantalum oxide/oxide trilayer dielectric, an oxide/strontium titanate bilayer dielectric, an oxide/barium strontium titanate bilayer dielectric, an oxide/strontium titanate/oxide trilayer dielectric, an oxide/strontium titanate/barium strontium titanate trilayer dielectric, and an oxide/hafnium oxide/oxide trilayer dielectric.

12. The method according to claim 6, wherein the charge trapping dielectric comprises an ONO dielectric comprising at least one of a nitrided oxide layer, a silicon-rich silicon nitride layer.

13. The method according to claim 6, with a proviso that the charge trapping dielectric is not etched in the core region.

14. A method of forming a non-volatile semiconductor memory device, comprising sequentially:

forming a charge trapping dielectric over a substrate, the substrate having a core region and a periphery region;

forming buried bitlines in the core region;

removing at least a portion of the charge trapping dielectric in the periphery region;

forming a gate dielectric in the periphery region; and forming gates in the core region and the periphery region, with a proviso that LOCOS is not formed in the core region.

15. The method according to claim 14, wherein the buried bitlines are formed by implanting at least one of arsenic, boron, and phosphorus.

16. The method according to claim 14, wherein the gate dielectric in the periphery region has a thickness from about 30 Å to about 300 Å.

17. The method according to claim 14, wherein the charge trapping dielectric comprises one of an ONO trilayer dielectric, an oxide/nitride bilayer dielectric, a nitride/oxide bilayer dielectric, an oxide/tantalum oxide bilayer dielectric, an oxide/tantalum oxide/oxide trilayer dielectric, an oxide/strontium titanate bilayer dielectric, an oxide/barium strontium titanate bilayer dielectric, an oxide/strontium titanate/oxide trilayer dielectric, an oxide/strontium titanate/barium strontium titanate trilayer dielectric, and an oxide/hafnium oxide/oxide trilayer dielectric.

18. The method according to claim 14, wherein the buried bitlines have a width from about 0.18 $\mu$m to about 1 $\mu$m.

19. The method according to claim 14 further comprising performing a blanket threshold implant prior to forming the charge trapping dielectric over the substrate.

20. The method according to claim 14 further comprising performing a threshold implant after forming the charge trapping dielectric over the substrate and prior to forming buried bitlines in the core region.

21. The method according to claim 14, with a proviso that the charge trapping dielectric is not etched in the core region.

* * * * *